United States Patent
Guo et al.

(10) Patent No.: US 11,942,503 B2
(45) Date of Patent: Mar. 26, 2024

(54) MODULE AND METHODS OF ASSEMBLY FOR LARGE AREA FLAT PANEL DETECTORS

(71) Applicant: EASTERN BLUE TECHNOLOGIES, INC., Ballston Spa, NY (US)

(72) Inventors: Jianjun Guo, Ballston Spa, NY (US); Yin Qian, Ballston Spa, NY (US)

(73) Assignee: EASTERN BLUE TECHNOLOGIES, INC., Ballston Spa, NY (US)

( * ) Notice: Subject to any disclaimer, the term of this patent is extended or adjusted under 35 U.S.C. 154(b) by 741 days.

(21) Appl. No.: 17/053,877

(22) PCT Filed: May 8, 2019

(86) PCT No.: PCT/US2019/031259
§ 371 (c)(1),
(2) Date: Sep. 14, 2021

(87) PCT Pub. No.: WO2019/217516
PCT Pub. Date: Nov. 14, 2019

(65) Prior Publication Data
US 2021/0327946 A1    Oct. 21, 2021

Related U.S. Application Data

(60) Provisional application No. 62/668,537, filed on May 8, 2018.

(51) Int. Cl.
*H01L 27/146* (2006.01)
*H04N 25/77* (2023.01)

(52) U.S. Cl.
CPC .. *H01L 27/14636* (2013.01); *H01L 27/14634* (2013.01); *H01L 27/14658* (2013.01);
(Continued)

(58) Field of Classification Search
CPC ......... H01L 27/14636; H01L 27/14634; H01L 27/14658; H01L 27/14621;
(Continued)

(56) References Cited

U.S. PATENT DOCUMENTS

2003/0128442 A1    7/2003   Tanaka et al.
2006/0268144 A1    11/2006  Tan et al.
(Continued)

*Primary Examiner* — Savitri Mulpuri
(74) *Attorney, Agent, or Firm* — FOX ROTHSCHILD LLP

(57) ABSTRACT

An image sensor unit is disclosed that includes an array of image sensing pixels, arranged in a plurality of rows and a plurality of columns, wherein each pixel is individually addressable. Each row of pixels is controlled via a row control in communication with the row of pixels in the array via a row addressing line, and capable of selectively addressing one or more of the plurality of rows. Each column of pixels is controlled by a column control in communication with each column of pixels in the array via a column addressing line, and capable of selectively addressing one or more of the plurality of columns. A unit controller is configured to specify selective readout of one or more pixel readout signals by instructing the row and column control to address one or more specific rows and columns of the array. A flat panel image sensor may include image sensor chips mounted on a substrate, the substrate may include a plurality of openings, and each of the plurality of openings enables access to at least one image sensor unit of the image sensor units. Each image sensor chip may include at least one chip contact array where at least one contact of each image sensor unit is accessible through at least one opening. The flat panel image sensor also may include a printed circuit board ("PCB") attached to the substrate, which includes PCB contact arrays and each PCB contact array may be in alignment with and in electrical connection with a corresponding chip contact array using electrically adhesive
(Continued)

paste. The substrate and the PCB may be aligned so that each ball of electrically conductive adhesive paste is in contact with one electrical contact pad to form an image sensor assembly.

7 Claims, 15 Drawing Sheets

(52) U.S. Cl.
CPC .... *H01L 27/14683* (2013.01); *H01L 27/1469* (2013.01); *H04N 25/77* (2023.01)

(58) Field of Classification Search
CPC ........... H01L 27/14632; H01L 27/1464; H01L 27/14641; H01L 27/14683; H01L 23/481; H01L 2924/0002; H01L 2924/00; H04N 25/77
See application file for complete search history.

(56) References Cited

U.S. PATENT DOCUMENTS

| | | |
|---|---|---|
| 2010/0283143 A1* | 11/2010 | Liu ..................... H01L 23/4334 257/713 |
| 2011/0141318 A1 | 6/2011 | Lee et al. |
| 2012/0074327 A1 | 3/2012 | Saito |
| 2013/0113967 A1 | 5/2013 | Wang |
| 2013/0242155 A1 | 9/2013 | Oganesian |
| 2013/0344653 A1* | 12/2013 | Sabatini ............. H01L 23/5389 438/107 |
| 2014/0070348 A1 | 3/2014 | Yee et al. |
| 2016/0066426 A1* | 3/2016 | Chen ................. H01L 23/49838 174/268 |
| 2016/0190204 A1 | 6/2016 | Chiu |
| 2017/0052263 A1 | 2/2017 | Jadrich et al. |
| 2017/0263561 A1* | 9/2017 | Mason ................... H05K 1/113 |

* cited by examiner

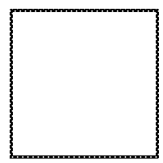
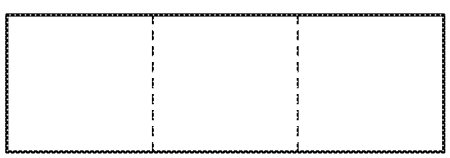
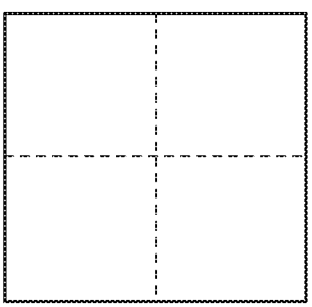
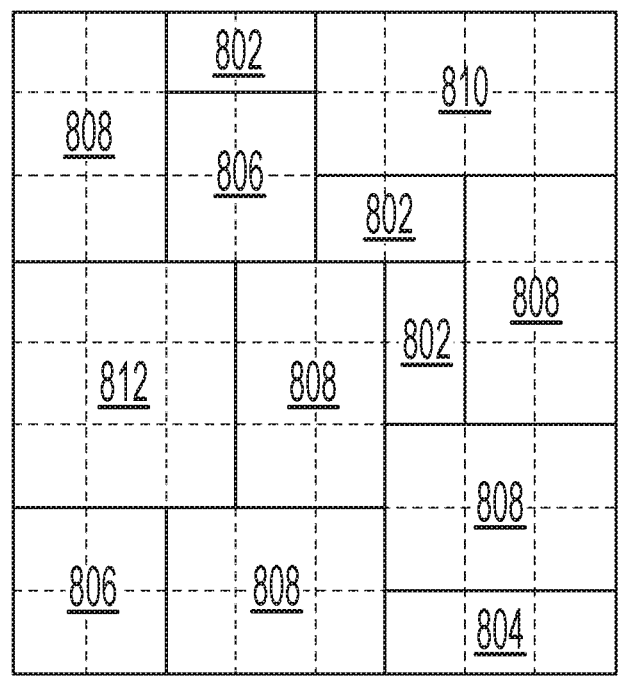
FIG. 7
FIG. 8

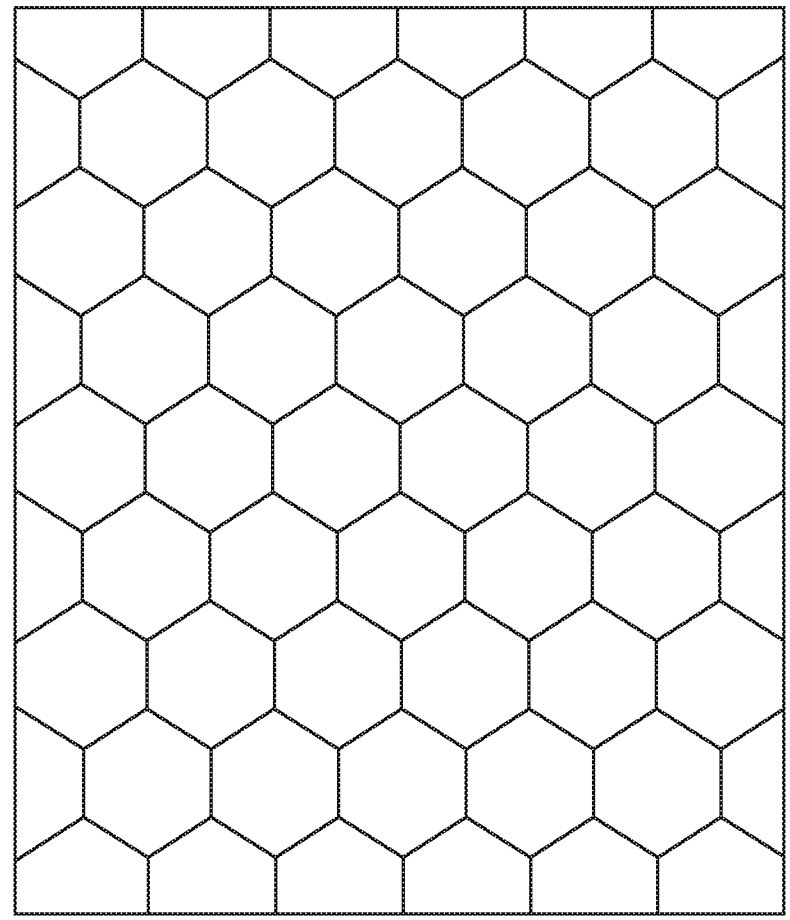
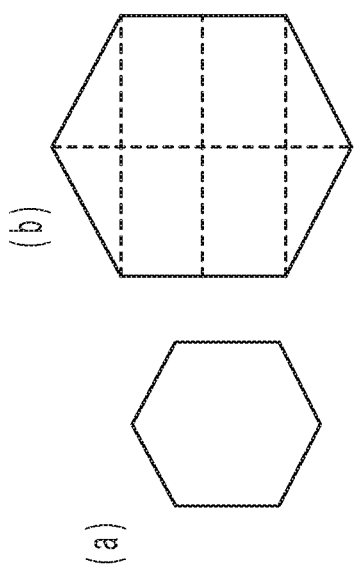
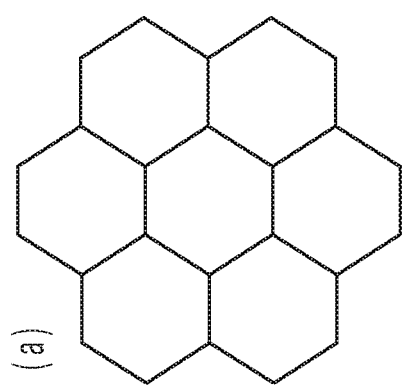
FIG. 15
FIG. 16

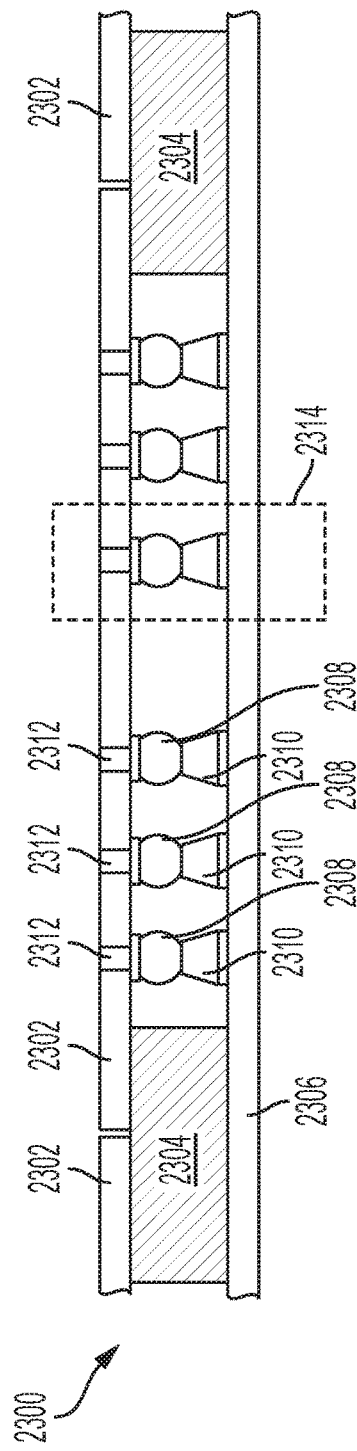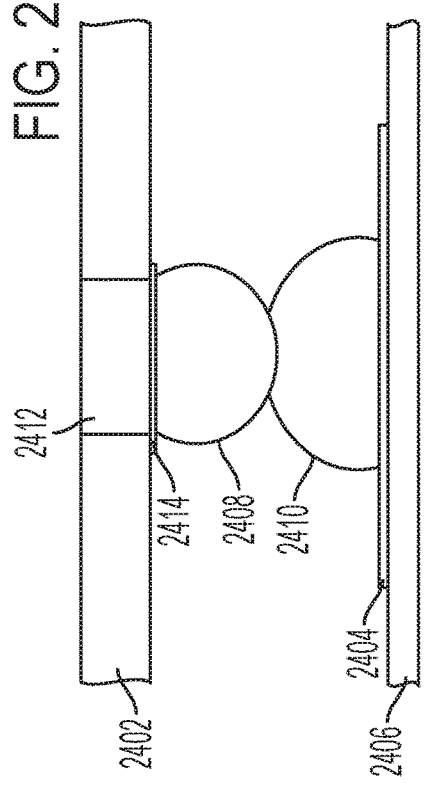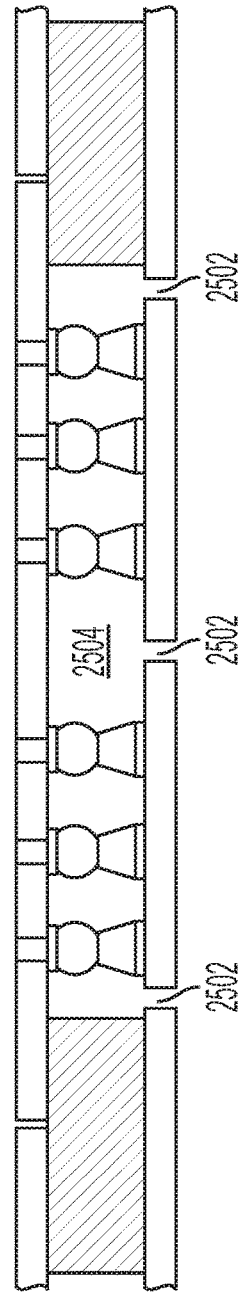
FIG. 23
FIG. 24
FIG. 25

MODULE AND METHODS OF ASSEMBLY FOR LARGE AREA FLAT PANEL DETECTORS

FIELD OF THE DISCLOSURE

This disclosure relates to the field of image sensor detectors, specifically image sensors for use in large area flat panel detectors primarily for X-ray imaging and radiation detection.

BACKGROUND

This disclosure relates to, for example, an implementation for large area flat panel detectors for X-ray imaging and radiation detection. Existing technologies for similar large format sensors include amorphous Silicon (a-Si) thin-film transistor (TFT) technology. However, since these sensors include a single circuitry, they are configured only to read out the array row by row in a sequential manner They do not allow for selective or patterned read-outs.

Other technologies include wafer scale complementary metal-oxide-semiconductor (CMOS) image detectors, for example, a three-sided buttable wafer scale imager. These sensors have sensing pixels up to the edges of each wafer on three sides. This allows multiple sensors, for example, manufactured on 200 mm silicon wafers, to be 'butted' or 'tiled' together in a 2×2 arrangement to form a larger imaging area and to meet the requirements, for example, for mammography applications. Additionally, any 2×N sensor arrangements are possible. As with a-Si TFT technology, these imaging sensors must still be read out row by row.

Image chip based detectors have also existed but are arranged in an offset manner. This arrangement requires sliding or rotating the detector and the stitching or composite of two complimentary images to arrive at a full image.

A need exists for a large format image sensor/detector that does not include the above-described drawbacks.

SUMMARY OF THE INVENTION

An image sensor unit is disclosed that includes an array of image sensing pixels, arranged in a plurality of rows and a plurality of columns, wherein each pixel is individually addressable. Each row of pixels is controlled via a row control circuitry in communication with the row of pixels in the array via a row addressing line, and the row control circuitry is capable of selectively addressing one or more of the plurality of rows. Each column of pixels is controlled by a column control circuitry in communication with each column of pixels in the array via a column addressing line, and the column control circuitry is capable of selectively addressing one or more of the plurality of columns. Also included in the image sensor unit is a unit controller in communication with the row control circuitry and the column control circuitry. The unit controller is configured to specify selective readout of one or more pixel readout signals by instructing the row control circuitry to address one or more specific rows of the array and by instructing the column control circuitry to address one or more specific columns of the array.

In an implementation, an image sensor unit includes a memory configured to store pixel locations, such the pixel locations specify one or more of a pre-defined readout pattern of pixels, pixels marked for repair, and pixels marked to skip readout, for example.

In an implementation, an image sensor unit includes at least one signal amplifier configured to output amplified signals. In an implementation, the image sensor unit has at least two signal amplifiers. The image sensor unit may also include an analog multiplexor in communication with the unit controller and configured to receive pixel readout signals from one or more pixels and generate a multiplexed readout signal, wherein the unit controller is configured to specify one or more of the pixel read out signals to send to the analog multiplexor from which the multiplexed readout signal is generated and one or more signal amplifiers to receive the multiplexed readout signal from the analog multiplexor. The memory may be further configured to store multiplexed pixel readout patterns.

In an implementation, a plurality of image sensor units are combined to form a large area flat panel of image sensor units. Image sensor units may be combined in parallel or in series. In an implementation, a large area flat panel image sensor includes a plurality of image sensor units, with each image sensor unit further including an array of image sensing pixels, arranged in a plurality of rows and a plurality of columns, wherein each pixel is individually addressable. Each row of pixels is controlled via a row control circuitry in communication with the row of pixels in the array via a row addressing line, and the row control circuitry is capable of selectively addressing one or more of the plurality of rows. Each column of pixels is controlled by a column control circuitry in communication with each column of pixels in the array via a column addressing line, and the column control circuitry is capable of selectively addressing one or more of the plurality of columns. Also included in the image sensor unit is a unit controller in communication with the row control circuitry and the column control circuitry. The unit controller is configured to specify selective readout of one or more pixel readout signals by instructing the row control circuitry to address one or more specific rows of the array and by instructing the column control circuitry to address one or more specific columns of the array.

In an implementation, each image sensor unit may be disposed on one of a plurality of chips. The plurality of chips may be arranged in an irregular pattern such that no single seam between chips extends across the entire large area flat panel image sensor. The plurality of chips may vary in size or may be the same size.

The large area flat panel image sensor may also include a structured substrate that includes a plurality of openings, where the plurality of chips are attached to the substrate such that a chip contact array of each of the plurality of image sensor units is accessible through at least one of the plurality of openings.

The large area flat panel image sensor may also include a printed circuit board ("PCB") having a plurality of PCB electrical contact arrays, where each PCB electrical contact array is configured to be placed in alignment and in electrical contact with a corresponding chip contact array. The PCB may include a plurality of through-holes through which underfill may be injected to provide additional structural support for the large area flat panel image sensor. The substrate and the underfill may be comprised of material that has a coefficient of thermal expansion similar to that of the plurality of chips.

A method of constructing a flat panel image sensor array may include forming a plurality of image sensor units that include an array of image sensing pixels, arranged in a plurality of rows and a plurality of columns, wherein each pixel is individually addressable. Each row of pixels is controlled via a row control circuitry in communication with the row of pixels in the array via a row addressing line, and the row control circuitry is capable of selectively addressing one or more of the plurality of rows. Each column of pixels is controlled by a column control circuitry in communication with each column of pixels in the array via a column addressing line, and the column control circuitry is capable of selectively addressing one or more of the plurality of columns. Also included in the image sensor unit is a unit controller in communication with the row control circuitry and the column control circuitry. The unit controller is configured to specify selective readout of one or more pixel readout signals by instructing the row control circuitry to address one or more specific rows of the array and by instructing the column control circuitry to address one or more specific columns of the array. The image sensor unit may also include a memory configured to store pixel locations, where the pixel locations specify one or more of a pre-defined readout pattern of pixels, pixels marked for repair, and pixels marked to skip readout and at least one signal amplifier configured to output amplified signals.

The method may also include mounting the plurality of image sensor units on a substrate, where the substrate includes a plurality of openings, each opening corresponding one image sensor unit of the plurality of image sensor units, and where a sensor contact array on each image sensor unit is accessible through each opening; attaching a printed circuit board ("PCB") to the substrate, wherein the PCB includes a plurality of PCB contact arrays, wherein each PCB contact array is configured to be placed in alignment and in electrical connection with a corresponding chip contact array; forming on each PCB contact array and each chip contact array a ball of electrically conductive adhesive paste; aligning the substrate and the PCB so that each ball of electrically conductive adhesive paste is in contact with one electrical contact pad to form an image sensor assembly; and curing the image sensor assembly.

Also included in the method of constructing a large area flat panel image sensor may be injecting underfill into one or more through-holes in the substrate to provide additional structural support for the large area flat panel image sensor.

In another embodiment, a flat panel image sensor may include a plurality of image sensor chips mounted on a substrate, wherein the substrate includes a plurality of openings, wherein each of the plurality of openings enables access to at least one image sensor unit of the plurality of image sensor units, and wherein each image sensor chip includes at least one chip contact array and wherein at least one contact of each image sensor unit is accessible through at least one opening. The flat panel image sensor also may include a printed circuit board ("PCB") attached to the substrate, wherein the PCB includes a plurality of PCB contact arrays, wherein each PCB contact array is in alignment with and in electrical connection with a corresponding chip contact array using electrically adhesive paste. The substrate and the PCB may be aligned so that each ball of electrically conductive adhesive paste is in contact with one electrical contact pad to form an image sensor assembly.

The plurality of image sensor chips forming the flat panel image sensor may be arranged in a pattern such that no single seam between chips extends across the entire flat panel image sensor. The plurality of chips may or may not vary in one or both of size and shape. Each image sensor chip may be comprised of one or more image sensor units. The plurality of chips may be attached to the substrate such that a chip contact of each of the plurality of image sensor units is accessible through at least one of the plurality openings.

PCB may include a plurality of through-holes, the large area flat panel image sensor further comprising underfill that has been injected into at least one of the through-holes to provide additional structural support for the flat panel image sensor, and at least one of the through-holes is reserved for venting out air during the process of underfilling. The substrate and the underfill may be comprised of material that has a coefficient of thermal expansion similar to that of the plurality of chips.

BRIEF DESCRIPTION OF THE DRAWINGS

The various aspects, features and embodiments of the image sensors and detector systems, architectural structure and its method of operation will be better understood when read in conjunction with the figures provided. Embodiments are provided in the figures for the purpose of illustrating aspects, features and/or various embodiments of the image sensors and detector systems, architectural structure and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

FIGS. 7a, 7b, 7c and 7d are a set of example patterns of one or more image sensor units for incorporation into an image sensor chip.

FIG. 8 is an example large area flat panel incorporating a random pattern of image sensor chips.

FIG. 15a is a single unit hexagonal-shape image sensor chip.

FIG. 15b is a hexagonal-shape image sensor unit chip having different size/shape of pixels.

FIG. 16a is a geometric pattern of hexagonal-shape image sensor chip arrays.

FIG. 16b is an example of a large area flat panel incorporating the geometric pattern of hexagonal-shape image sensor chip arrays.

FIG. 23 is a detail view of connections between an image sensor unit and a mounted printed circuit board.

FIG. 24 is a detail view of a single connection between an image sensor unit and a mounted printed circuit board.

FIG. 25 is a detail view of connections between an image sensor unit and a mounted printed circuit board designed for injection of underfill.

DETAILED DESCRIPTION OF THE PREFERRED EMBODIMENTS

Embodiments of the present invention are not limited to the particular methodology, uses, and applications described herein, as these may vary. It is also to be understood that the terminology used herein is used for the purpose of describing particular embodiments only, and is not intended to limit the scope of all embodiments of the present invention. It must be noted that as used herein and in the appended claims, the singular forms "a," "an," and "the" include the plural reference unless the context clearly dictates otherwise. Thus, for example, a reference to "an element" is a reference to one or more elements, and includes equivalents thereof known to those skilled in the art. Similarly, for another example, a reference to "a step" or "a means" is a reference to one or more steps or means and may include sub-steps or subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Unless defined otherwise, all technical and scientific terms used herein have the same meanings as commonly understood by one of ordinary skill in the art to which this invention belongs. Preferred methods, techniques, devices and materials are described although any methods, techniques, devices, or materials similar or equivalent to those described may be used in the practice or testing of the present invention.

All patents and other publications discussed are incorporated herein by reference for the purpose of describing and disclosing, for example, the methodologies described in such publications that might be useful in connection with the present invention. These publications are provided solely for their disclosure prior to the filing date of the present application. Nothing in this regard should be construed as an admission that the inventors are not entitled to antedate or otherwise remove any such publication or patent as prior art for any reason.

Figure 1:
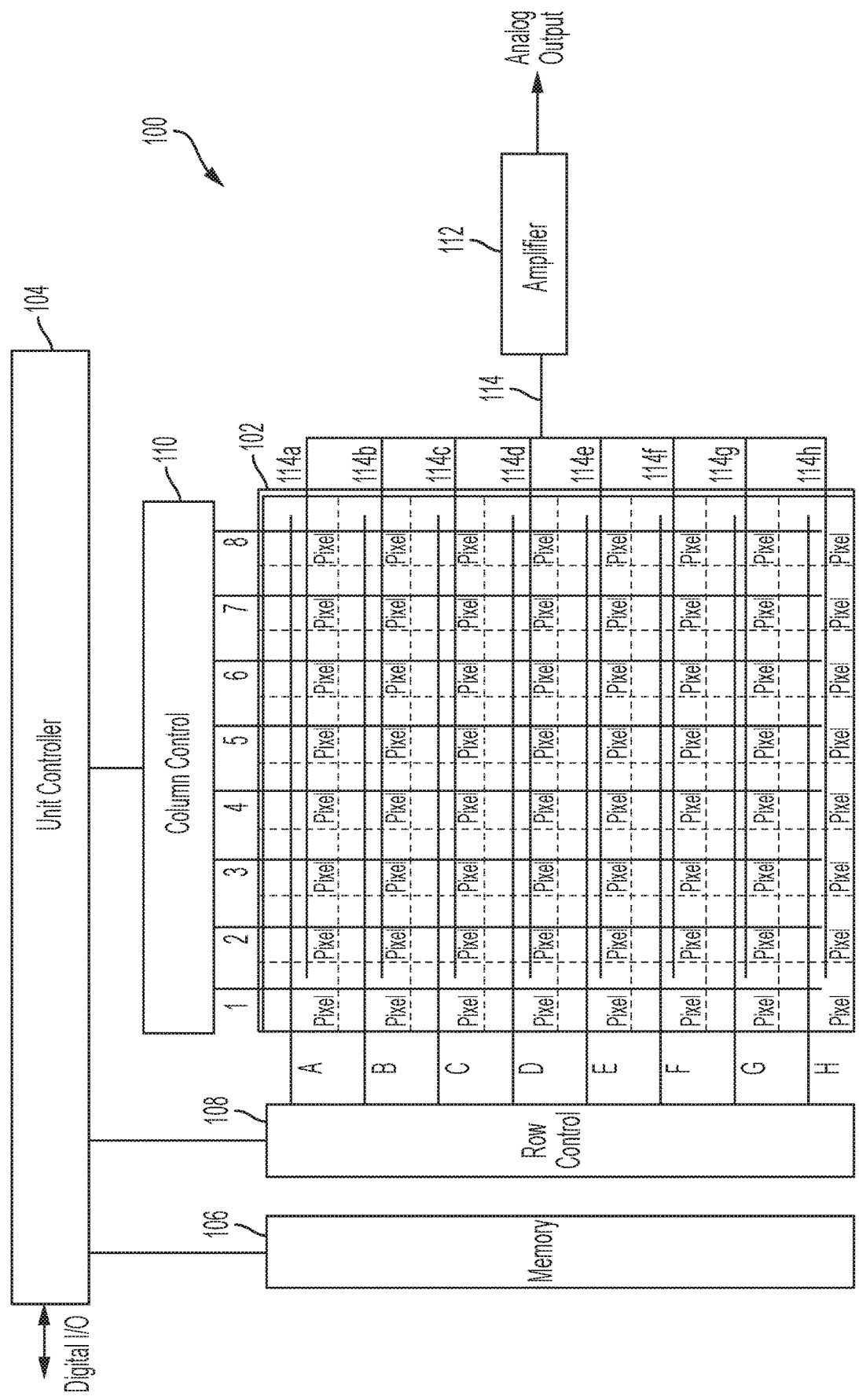
FIG. 1 is a diagram of an implementation of an image sensor unit.

Image sensor units are individual, modular units of sensor arrays that may be integrated with certain electronics, for example, one or more of control logic, analog multiplexer, analog amplifiers, and similar option hardware. Referring now to FIG. 1, an implementation of an image sensor unit 100 is shown. Image sensor unit 100 includes sensor pixel array 102, unit controller 104, memory 106, row control circuitry 108 (or more simply, row control 108), and column control circuitry 110 (or more simply, column control 110). An analog amplifier 112 may also be included, and may be located either on the same chip as the image sensor unit or off-chip.

The image sensor unit 100 includes a two-dimensional addressing scheme using the row control 108 and row addressing lines A-H and column control 110 and column addressing lines 1-8. Instead of the conventional sequential row-by-row readout, the pixels in the sensor pixel array 102 can be selectively read out in any order, whether predefined or selected on the fly. Pixels can be read out individually, or in any combination with any other pixel(s) (or "binning") to put more than one pixel on the data line(s) 114, 114a-h to the amplifier 112. Any binning pattern (for example, no binning, 2×1, 2×2, 2×3, etc.) can be predefined or programmed to the unit on demand Sensor pixel array 102 includes individual pixels that can be passive or active, for example, amorphous silicon pixels, 3T CMOS active pixels, and may be arranged in any suitable pattern. In the example of FIG. 1, the pixels are arranged in an 8×8 array, but implementations of an image sensor unit are not limited in this regard.

Unit controller 104 communicates, for example, with external devices and/or control logic at different hierarchy level on the chip, access memory 106, and control the row control 108 and column control 110. In an implementation, unit controller 104 communicates with a field-programmable gate array, an application specific integrated circuit, and/or imager control logic. For example, those external devices send readout patterns to the unit controller, synchronize the operation of all the image sensor units 100 in the imager. In an implementation, unit controller 104 communicates with chip level control logic, a layer of the logic control hierarchy in the imager, for further configuration of operating the pixels in the unit, for example, binning modes, readout pattern and sequencing, etc. Row control 108 may be configured to selectively assert any single row or group of rows concurrently. For example, Row control 108 may assert a row alone or may assert any number of rows. Concurrently asserted rows may or may not be contiguous. For example, row control 108 may assert row A and B concurrently. Alternatively, row control 108 may assert rows A and C but not row B Similarly, column control 110 may be configured to assert a single column alone or any number of columns. For example, column control 110 may assert column 2 alone, or may assert columns 2 and 3 concurrently. Alternatively, column control 110 may assert columns 1 and 3 or 1 and 4 concurrently, for example. To select an individual pixel, a single row and a single column are asserted. For example, asserting row C and column 5 sends the value of pixel C5 to the data line 114*c* to data line 114 to the amplifier 112. Binned patterns can be asserted by asserting row and column combinations that define the particular pattern desired. For example, asserting rows A and B and columns 2 and 3 yields a 2×2 pattern with pixels A2, A3, B2, and B3. One of ordinary skill will understand how other patterns can be asserted.

Memory 106 is used to store pre-defined readout patterns, for example. Additionally, the locations of pixels for repair or to skip read out (e.g. bad pixels) may be stored in memory 106. In an example readout scheme, each pixel is read out one by one through the amplifier 112. The amplifier 112 outputs an analog signal for further processing off the chip, for example, time stamping and/or digitization.

Figure 2:
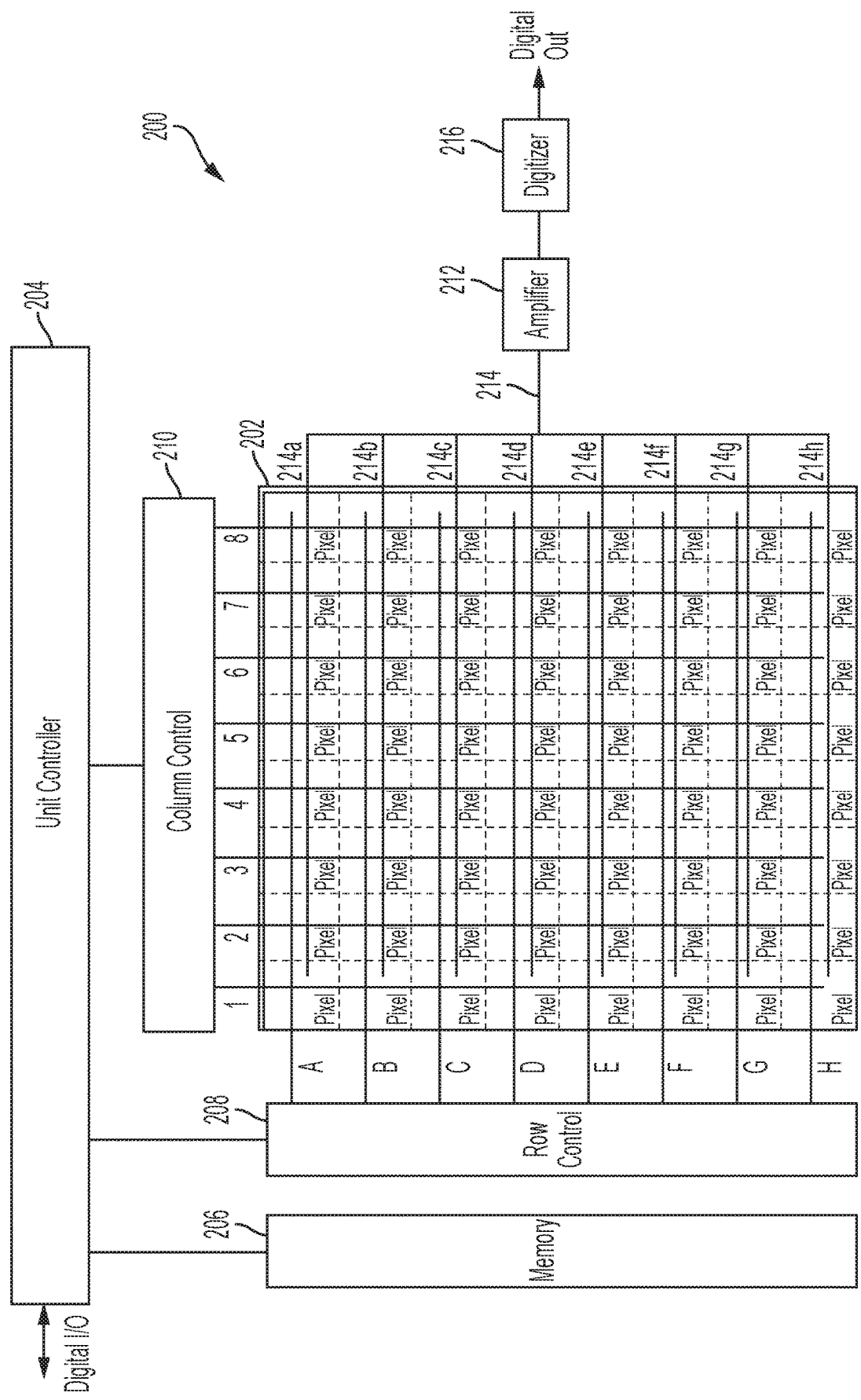
FIG. 2 is a diagram of an implementation of an image sensor unit.

Referring now to FIG. 2, another implementation of an image sensor unit 200 is shown that outputs a digital signal. Image sensor unit 200 includes sensor pixel array 202, unit controller 204, memory 206, row control 208, and column control 210. An analog amplifier 212 and a digitizer 216 may also be included, and may be located either on the same chip as the image sensor unit or off-chip Similar to image sensor unit 100 of FIG. 1, image sensor unit 200 includes a two-dimensional addressing scheme using the row control 208 and row addressing lines A-H and column control 210 and column addressing lines 1-8. Instead of the conventional sequential row-by-row readout, the pixels in the sensor pixel array 202 can be read out in any order, whether predefined or selected on the fly. Pixels can be selectively read out individually, or in any combination with any other pixel(s) (or "binning") to put more than one pixel on the data line(s) 214, 214*a-h* to the amplifier 212 and digitizer 216. Any binning pattern (for example, no binning, 2×1, 2×2, 2×3, etc.) can be predefined or programmed to the unit on demand Sensor pixel array 202 includes individual pixels that can be passive or active and may be arranged in any suitable pattern. In the example of FIG. 2, the pixels are arranged in an 8×8 array, but implementations of an image sensor unit are not limited in this regard.

Unit controller 204 communicates, for example, with external devices and/or control logic at different hierarchy level on the chip, access memory 206, and control the row control 208 and column control 210. In an implementation, Unit controller 204 communicates with a field-programmable gate array, an application specific integrated circuit, and/or imager control logic. For example, those external devices send readout patterns to the unit controller and synchronize the operation of all the image sensor units 200 in the imager. In an implementation, unit controller 204 communicates with chip level control logic, a layer of the logic control hierarchy in the imager, for further configuration of the operation of the pixels in the unit, for example, binning modes, readout pattern and sequencing, etc. Row control 208 may be configured to assert any single row or group of rows concurrently. For example, Row control 208 may assert a row alone or may assert any number of rows. Concurrently asserted rows may or may not be contiguous. For example, row control 208 may assert row A and B concurrently. Alternatively, row control 208 may assert rows A and C but not row B. Similarly, column control 210 may be configured to assert a single column alone or any number of columns. For example, column control 210 may assert column 2 alone, or may assert columns 2 and 3 concurrently. Alternatively, column control 210 may assert columns 1 and 3 or 1 and 4 concurrently, for example. To select an individual pixel, a single row and a single column are asserted. For example, asserting row C and column 5 sends the value of pixel C5 to the data line 214*c* to data line 214 to the amplifier 212. Binned patterns can be asserted by asserting row and column combinations that define the particular pattern desired. For example, asserting rows A and B and columns 2 and 3 yields a 2×2 pattern with pixels A2, A3, B2, and B3. One of ordinary skill will understand how other patterns can be asserted.

Memory 206 is used to store pre-defined readout patterns, for example. Additionally, the locations of pixels for repair or to skip read out (e.g. bad pixels) may be stored in memory 206. In an example readout scheme, each pixel is read out one by one through the amplifier 212. The amplifier 212 outputs an analog signal for further processing and digitization in digitizer 216, for example.

Figure 3:
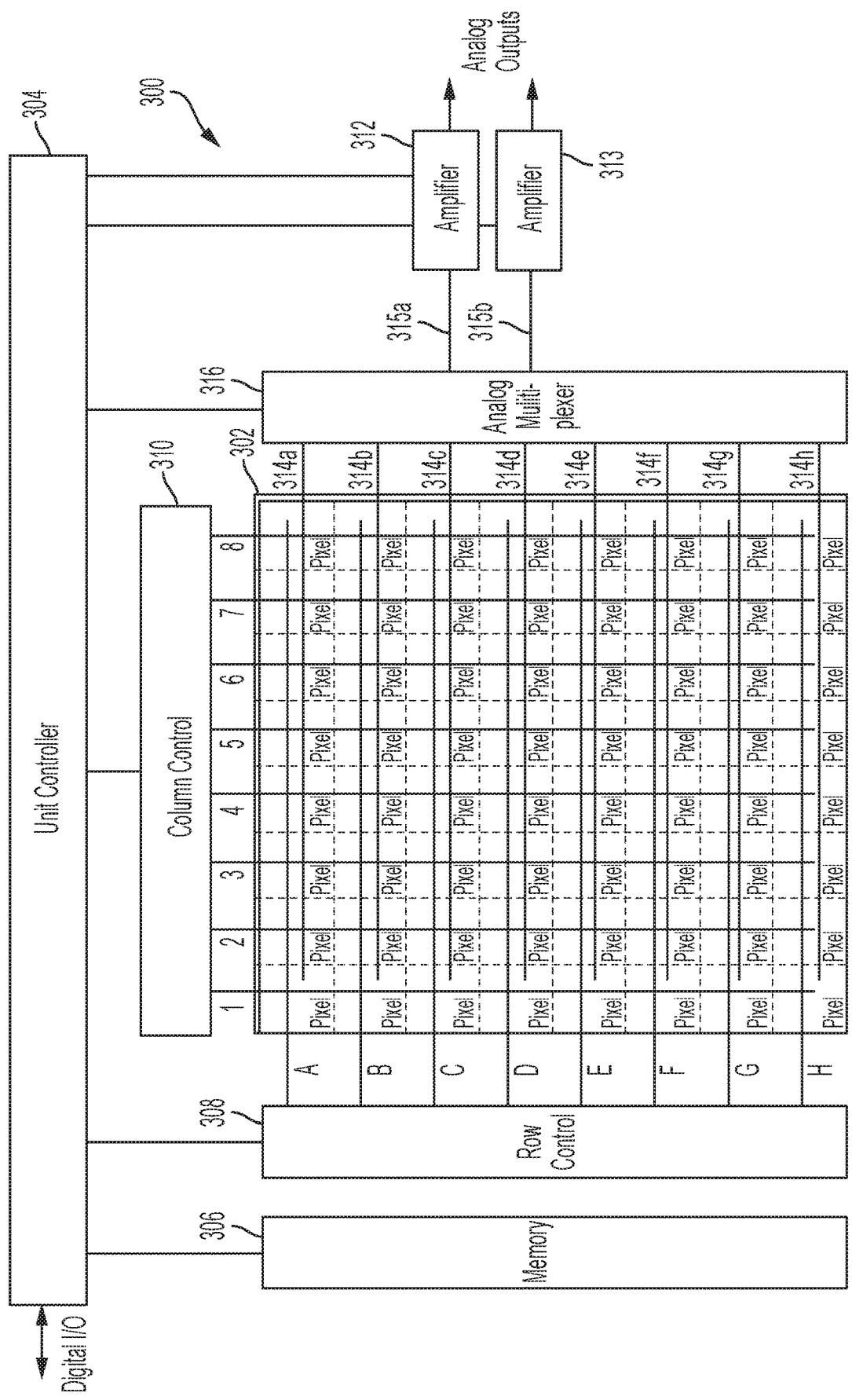
FIG. 3 is a diagram of an implementation of an image sensor unit.

Referring now to FIG. 3, another implementation of an image sensor unit 300 is shown that outputs a digital signal. Image sensor unit 300 includes sensor pixel array 302, unit controller 304, memory 306, row control 308, and column control 310. Analog amplifiers 312 and 313 may also be included, and may be located either on the same chip as the image sensor unit or off-chip Similar to image sensor unit 100 of FIG. 1, image sensor unit 300 includes a two-dimensional addressing scheme using the row control 308 and row addressing lines A-H and column control 310 and column addressing lines 1-8. Instead of the conventional sequential row-by-row readout, the pixels in the sensor pixel array 302 can be read out in any order, whether predefined or selected on the fly. Pixels can be selectively read out individually, or in any combination with any other pixel(s) (or "binning") to put more than one pixel on the data line(s) 314*a-h* and processed through analog multiplexer 316 to two or more amplifiers, for example amplifier 312 and amplifier 313. Any binning pattern (for example, no binning, 2×1, 2×2, 2×3, etc.) can be predefined or programmed to the unit on demand Sensor pixel array 302 includes individual pixels that can be passive or active and may be arranged in any suitable pattern. In the example of FIG. 3, the pixels are arranged in an 8×8 array, but implementations of an image sensor unit are not limited in this regard.

Unit controller 304 communicates, for example, with external devices and/or control logic at different hierarchy level on the chip, access memory 306, and control the row control 308 and column control 310. In an implementation, Unit controller 304 communicates with a field-programmable gate array, an application specific integrated circuit, and/or imager control logic. For example, those external devices send readout patterns to the unit controller and synchronize the operation of all the image sensor units 300 in the imager. In an implementation, unit controller 304 communicates with chip level control logic, a layer of the logic control hierarchy in the imager, for further configuration of the operation of the pixels in the unit, for example, binning modes, readout pattern and sequencing, etc. Row control 308 may be configured to assert any single row or group of rows concurrently. For example, Row control 308 may assert a row alone or may assert any number of rows. Concurrently asserted rows may or may not be contiguous. For example, row control 308 may assert row A and B concurrently. Alternatively, row control 308 may assert rows A and C but not row B. Similarly, column control 310 may be configured to assert a single column alone or any number of columns. For example, column control 310 may assert column 2 alone, or may assert columns 2 and 3 concurrently. Alternatively, column control 310 may assert columns 1 and 3 or 1 and 4 concurrently, for example. To select an individual pixel, a single row and a single column are asserted. For example, asserting row C and column 5 sends the value of pixel C5 to the data line 314c to data line 314 to the analog multiplexer 316 and one or both of amplifier 312 and amplifier 313. Binned patterns can be asserted by asserting row and column combinations that define the particular pattern desired. For example, asserting rows A and B and columns 2 and 3 yields a 2×2 pattern with pixels A2, A3, B2, and B3. One of ordinary skill will understand how other patterns can be asserted. Analog multiplexer 316 can also be used to send different signals to each amplifier. For example, row control 308 and column control 310 may assert pixels B2, B3, C2, and C3 to read out through data line 315a to amplifier 312 and pixels C5, C6, D5, and D6 to read out through data line 315b to amplifier 313.

Memory 306 is used to store pre-defined readout patterns, for example. Additionally, the locations of pixels for repair or to skip read out (e.g. bad pixels) may be stored in memory 306. In an example readout scheme using one amplifier each pixel is read out one by one to one of amplifier 312 and amplifier 313. Once the pixels are read out, amplifiers 312, 313 output an analog signal, for example, for further processing and digitization in a digitizer (not shown in FIG. 3) or other processing and/or output circuitry. In another example readout scheme using both amplifiers, unit controller 304 asserts pixels A1 and H1 simultaneously, assign pixel A1 to amplifier 312, and pixel H1 to amplifier 313, respectively, using analog multiplexer 316. In another example readout scheme for binned pixels, for example 2×2 binning: A1, A2, B1 and B2; G1, G2, H1 and H2. Using one amplifier, the unit controller 304 asserts row A and B, column 1 and 2, simultaneously, and the binned pixels (A1, A2, B1, and B2) are read out to the assigned amplifier through the analog multiplexer 316. Using both amplifiers, the unit controller 304 asserts row A, B, G, and H, column 1 and 2, simultaneously, assign a first binned pixel range (for example, A1, A2, B1, and B2) to amplifier 312, and a second binned pixel range (G1, G2, H1, and H2) Amplifier 313, respectively, through the analog multiplexer 316. Although not shown in FIG. 3, a digitizer may be integrated on the same chip to digitize the output signals of the amplifiers.

Figure 4:
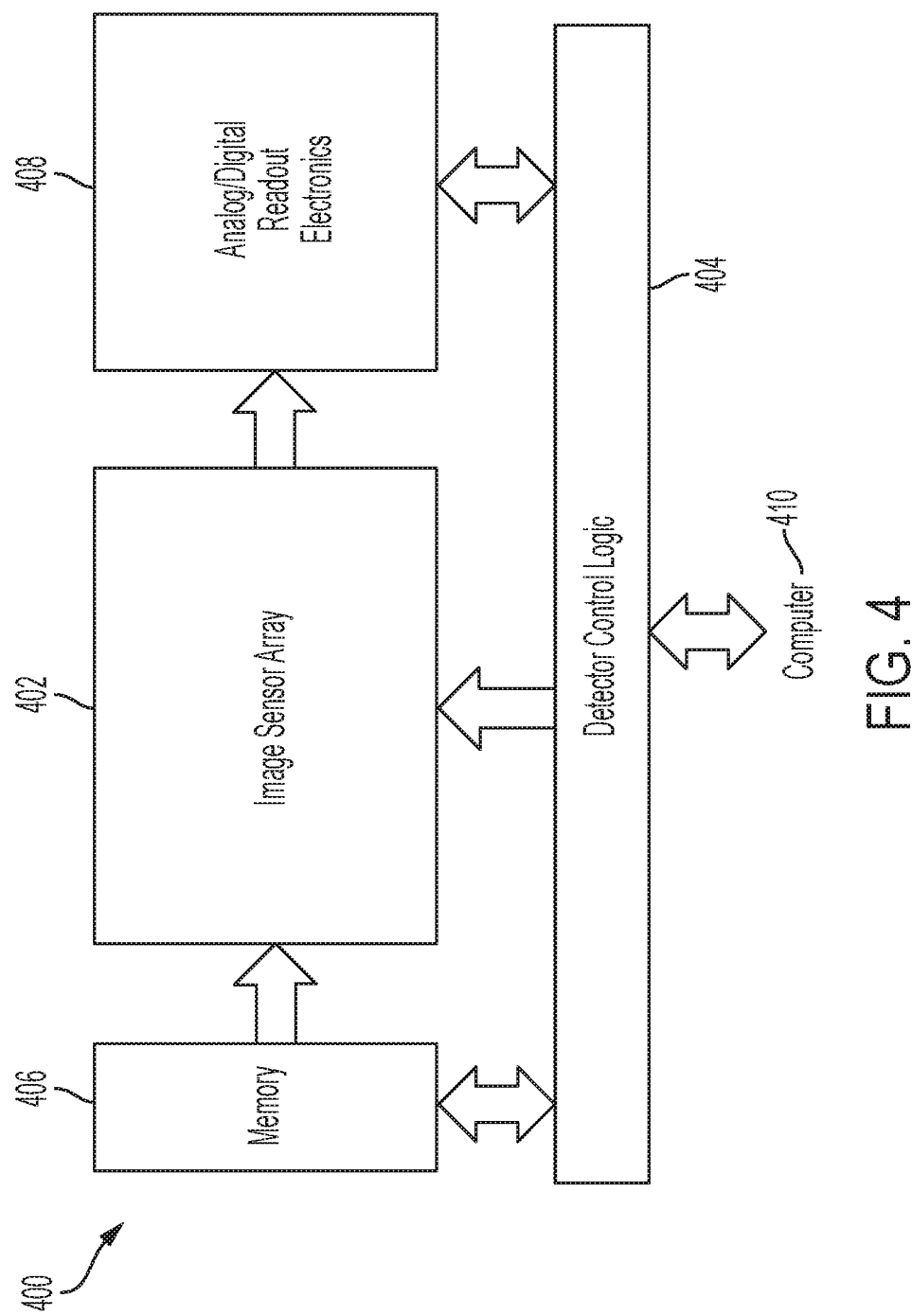
FIG. 4 is a block diagram of large area flat panel imager incorporating a plurality of image sensor units.

Referring now to FIG. 4, a block diagram of a large area flat panel imager 400 is shown. Imager 400 includes an image sensor array 402 comprising image senor units on chips with the same or different chip sizes, detector control logic 404, memory 406, and analog and/or digital readout electronics 408. Computer 410 may be connected to detector control logic 404 for provision of control commands and receipt of digital image signals and the like. The image sensor array may include any number of individual image sensor units, for example, one or more of image sensor units 100, 200, 300 as shown in FIGS. 1-3. A number of image sensor units are fabricated on a same die to form an image sensor chip. An image sensor chip may have chip level control logic for internal/external communication and control. Detector control logic 404, for example, may dynamically address and control any individual sensor unit at any time. Detector control logic 404 may also specify the readout pattern for the sensor unit, for example pixel binning modes and/or pixel readout sequence, and the readout sequence for the units in the array 402 at detector level, for example, read out one unit a time, or multi units simultaneously to achieve high frame rate. Memory 406 is used to store specific readout patterns for execution by the detector control logic 404. Analog/digital readout electronics 408 provides digitized signal from the image sensor units to the detector to complete the acquisition of an image.

To form an X-ray detector, a person of ordinary skill would understand how to deposit conversion materials (e.g. scintillators) on a fiber optic plate ("FOP") which is then placed on top of or directly onto the active side of the imager. In one embodiment, the conversion materials are deposited directly on the active side of the imager, without the fiber optic plate in between.

Figure 5:
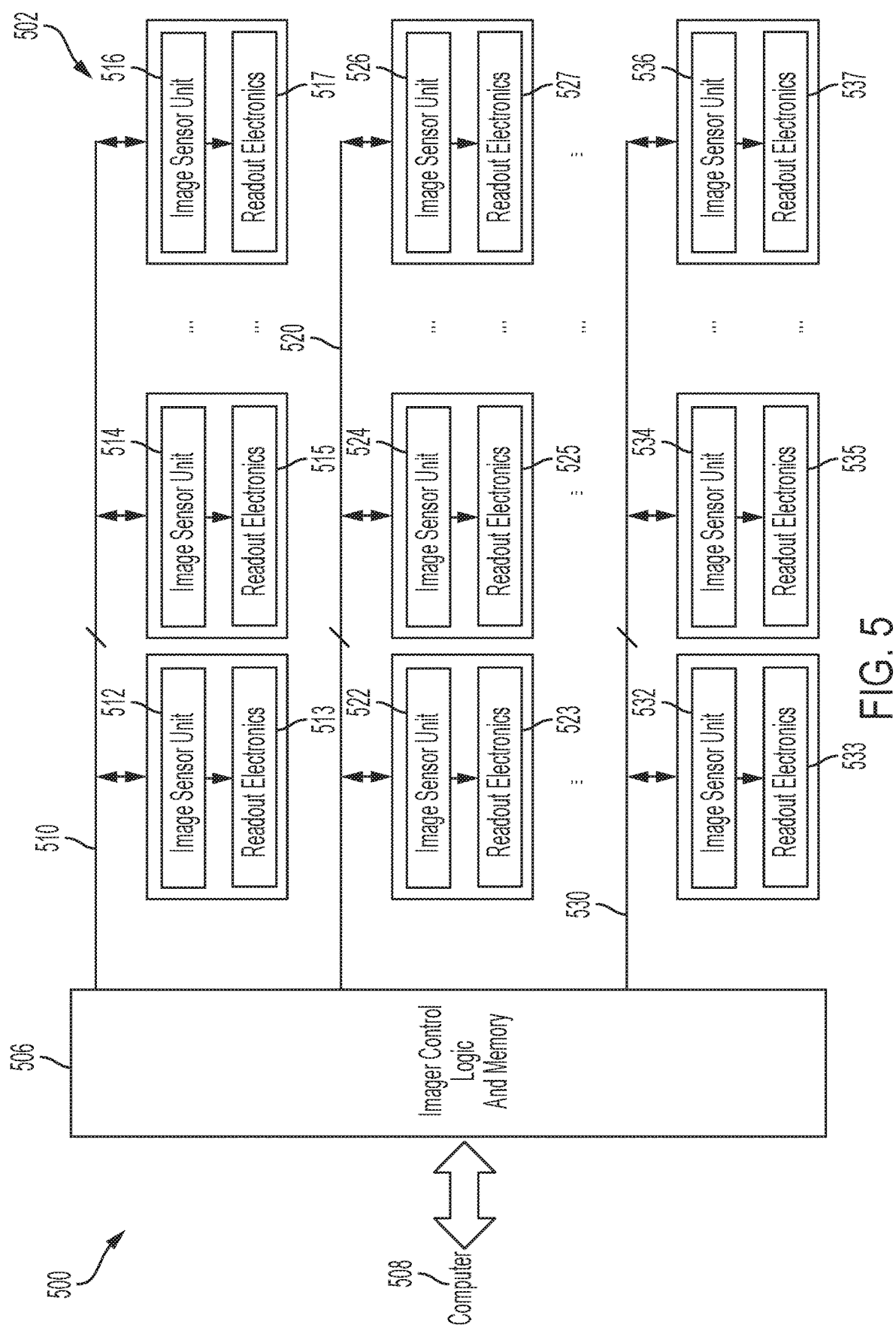
FIG. 5 is a diagram of an implementation of a large area flat panel imager incorporating a plurality of image sensor units.

Referring now to FIG. 5, an implementation of a large area flat panel imager 500 is shown. Flat panel imager 500 includes similar components to those shown in FIG. 4. For clarity, imager control logic and memory 506 have been combined into one block component. A person of ordinary skill will recognize that these may be separate components. Image sensor array 502 includes multiple image sensor units 512, 514, 516, 522, 524, 526, 532, 534, 536 which can be on one or more chips. Each image sensor unit may, for example, have its own analog and/or digital readout electronics, which makes the modular units expandable for making different sizes of flat panel imagers. Each sensor unit has readout electronics 513, 515, 517, 523, 525, 527, 533, 535, 537, on or off the chips. In the example of FIG. 5, image sensor units 512, 514, 516 may be connected in parallel to imager control logic and memory 506 via data bus 510. Similarly, image sensor units 522, 524, 526 may be connected in parallel to imager control logic and memory 506 via data bus 520, for example Image sensor units 532, 534, 536 may be connected in parallel to imager control logic and memory 506 via data bus 530. If the image sensor unit has built-in digitizer, its readout electronics may perform the function of digital readout. If the image sensor unit outputs analog signals, its readout may perform both digitization, using a digitizer off chip, and then digital read out to the imager control logic and memory 506 to computer 508. The imager control logic 506 controls every single image sensor unit in the panel directly or through the logic built in the image sensor chip. It is shown in FIG. 5, each image sensor unit has its own readout electronics, either on or off the chip. In one embodiment, two or more image sensor units may share one set of the readout electronics. In effect, each image sensor unit (or set of readout electronics) may be independently selected, accessed, and configured.

Figure 6:
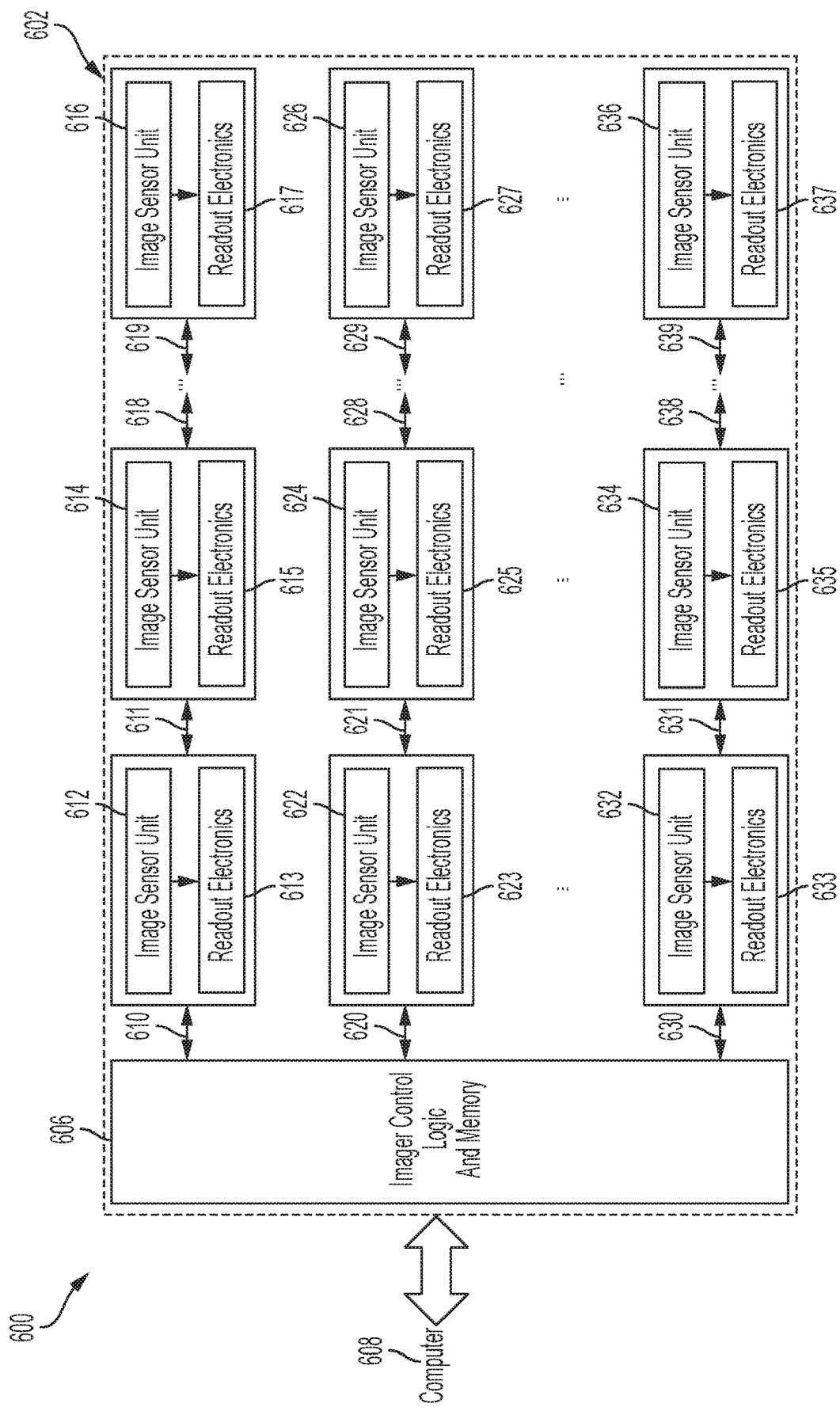
FIG. 6 is a diagram of an implementation of a large area flat panel imager incorporating a plurality of image sensor units.

Referring now to FIG. 6, an implementation of a large area flat panel imager 600 is shown. Flat panel imager 600 includes similar components to those described in reference to FIG. 5. For clarity, imager control logic and memory 606 have been combined into one block component. A person of ordinary skill will recognize that these may be separate components. Image sensor array 602 includes multiple image sensor units 612, 614, 616, 622, 624, 626, 632, 634, 636. Each image sensor unit may, for example, have its own analog and/or digital readout electronics, which makes the modular units expandable for making different sizes of flat panel imagers. Each sensor unit includes readout electronics 613, 615, 617, 623, 625, 627, 633, 635, 637. In the example of FIG. 6, image sensor units 612, 614, 616 form a series daisy chain connected to imager control logic and memory 606 via line 610 and to each other via lines 611, connecting image sensor units 612 and 614, and lines 618 and 619, connecting image sensor units 614 and 616 to intermediate image sensor units omitted from FIG. 6. Similarly, image sensor units 622, 624, 626 form a series daisy chain connected to imager control logic and memory 606 via line 620 and to each other via lines 621, connecting image sensor units 622 and 624, and lines 628 and 629, connecting image sensor units 624 and 626 to intermediate image sensor units omitted from FIG. 6. Image sensor units 632, 634, 636 form a series daisy chain connected to imager control logic and memory 606 via line 630 and to each other via lines 631, connecting image sensor units 632 and 634, and lines 638 and 639, connecting image sensor units 634 and 636 to intermediate image sensor units omitted from FIG. 6. If the image sensor unit has built-in digitizer, its readout electronics may perform the function of digital readout. If the image sensor unit outputs analog signals, its readout may perform both digitization, using a digitizer off chip and then digital read out to the imager control logic and memory 606 to computer 608. The imager control logic 606 controls every single image sensor unit in the panel directly or through the logic built in the image sensor chip. It is shown in FIG. 6, each image sensor unit has its own readout electronics, either on or off the chip. In one embodiment, two or more image sensor units share one set of readout electronics. In effect, each image sensor unit (or set of readout electronics) may be independently selected, accessed, and configured.

Figure 9:
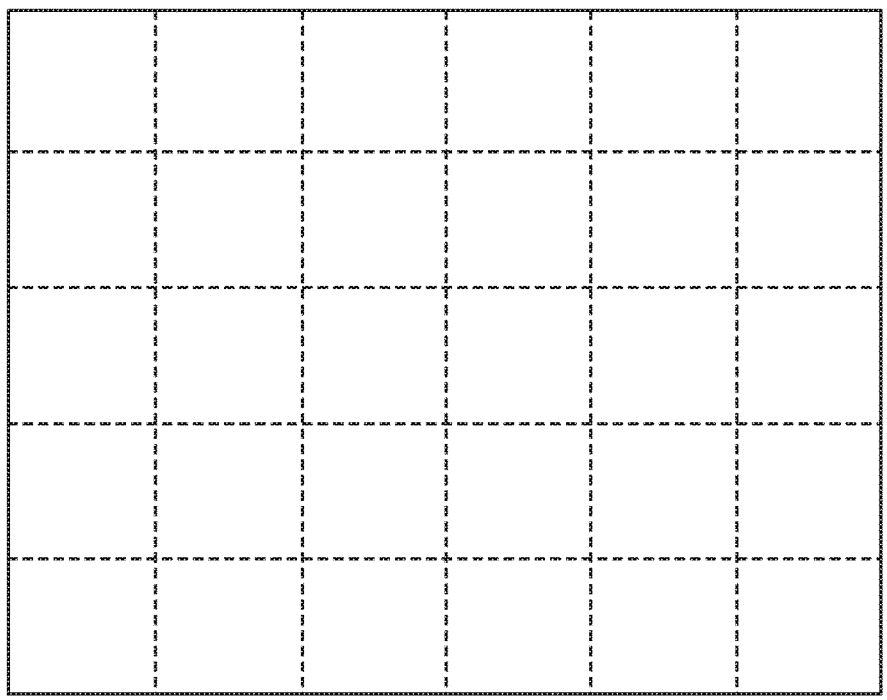
FIG. 9 is an example large-scale rectangle pattern of image sensor units for incorporation into an image sensor chip.
Figure 10:
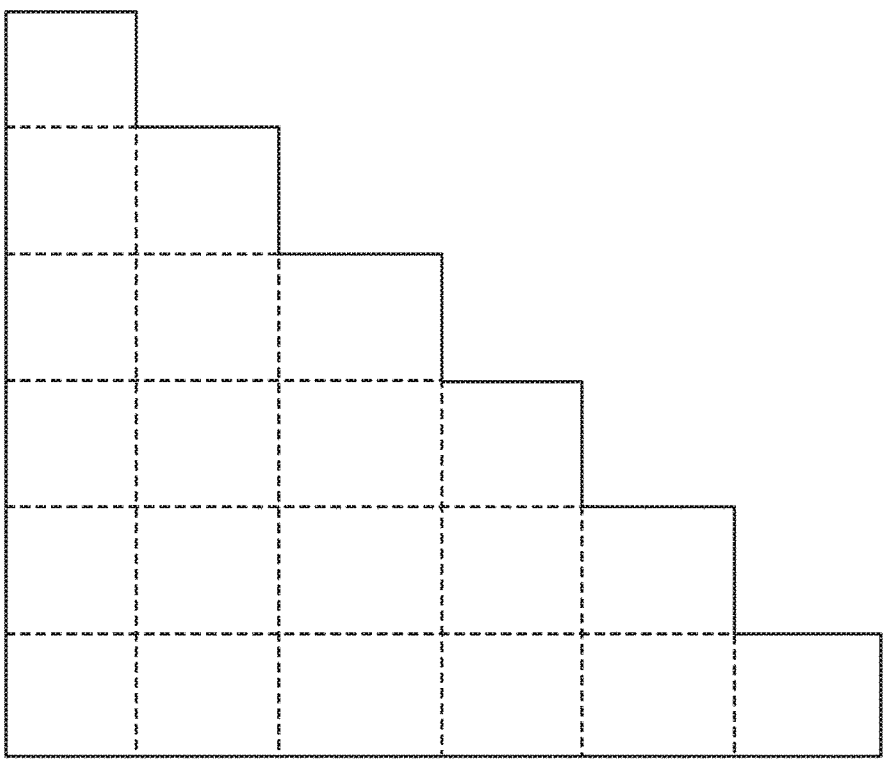
FIG. 10 is an example large-scale staircase pattern of image sensor units for incorporation into an image sensor chip.

Referring now to FIGS. 7-10, various example patterns of modular image sensor units to be placed on a single die to form an image sensor chip are shown. The chip can have any number of the image sensor units, arranged in any possible pattern, on a same die. In one implementation, chip level control logic may be built in with the image sensor units to further facilitating the communication and the control of the operations of the image sensor units on the chip. These chips may then be arranged into a large area flat panel. FIG. 7(*a*) shows a single image sensor unit per chip in a 1×1 configuration. FIG. 7(*b*) shows a two-unit chip arranged in a 1×2 configuration or a 2×1 configuration, depending on the placement orientation. FIG. 7(*c*) shows a three-unit chip arranged in a 1×3 configuration or a 3×1 configuration depending on the placement orientation. FIG. 7(*d*) shows a four-unit chip arranged in a 2×2 configuration. One of ordinary skill will understand that patterns may include other dimensions, including 2×3, 3×4, 3×3, and so on and that one or more of these chip patterns could be arranged into a large area flat panel detector. For example, FIG. 8 shows a large area flat panel comprising a number of different sized chips. In the example shown in FIG. 8, there are three 1×2 unit chips 802, one 1×3 unit chip 804, two 2×2 unit chips 806, five 2×3 unit chips, one 2×4 unit chip 810 and one 3×3 unit chip 806. In another example, FIG. 9 shows a single chip 5×6 unit flat panel image sensor array, and it may be at wafer size. In another example, FIG. 10 shows a large-scale single chip 21-unit staircase pattern.

If identical rectangular or square chips are used for an entire flat panel detector, seams formed across the imager in any direction due to the gap between the active region of chips, for example, the gap between the edges of adjacent chips, distance from the edge of the active region to the edge of the chip, may exhibit itself as a line defect in the image. If the gap is larger than the sensor pixel pitch, at least one line is lost. The lost line caused by the seam may be treated as a defect in the image. Conventionally, one may use the information obtained from the neighboring lines of pixels to recover partial information for the lost line. However, if there are too many "lost lines", or the gap is too large, the conventional method does not work well, and defects caused by those "lost lines" will show up in the image even after post processing. One method for dealing with this problem is to randomize the seam pattern and take advantage of the image sensor unit's ability to compensate for the lost image information in an adjacent chip. An example is shown in FIG. 8, described above, where the arrangement of different sized chips randomizes the location of the seams between chips.

Figure 11:
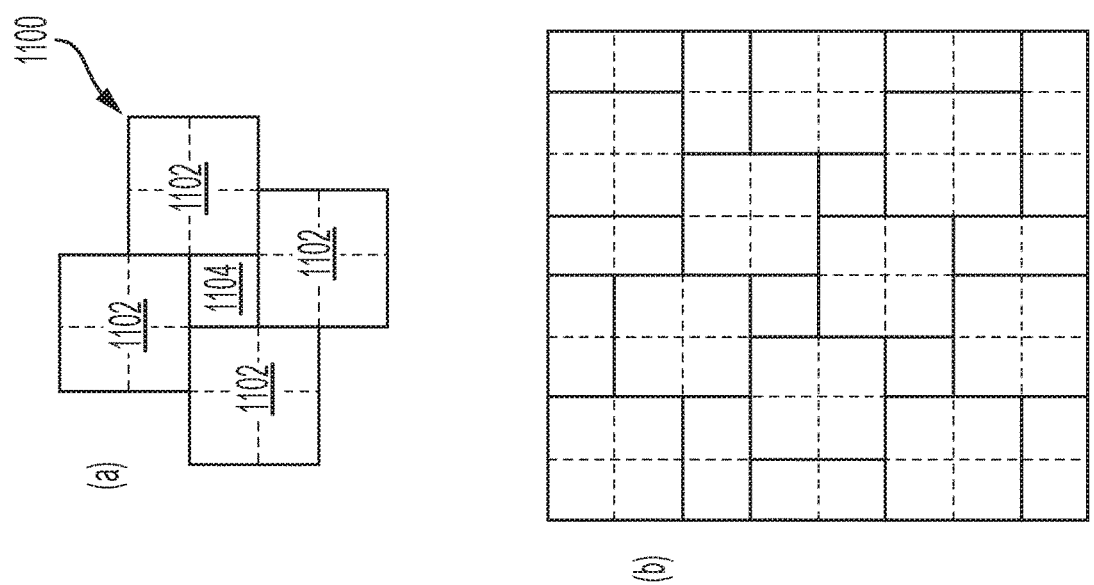
FIG. 11a is a geometric pattern of image sensor chips.
FIG. 11b is an example large area flat panel incorporating the geometric pattern of image sensor chips.

FIG. 11 shows another example of a randomized seam using a geometric pattern 1100 to ease manufacture. FIG. 11(*a*) shows a single pattern 1100 with four 2×2 unit chips 1102 surrounding a 1×1 unit chip 1104. FIG. 11(*b*) shows an example large area flat panel detector constructed using pattern 1100 and additional smaller chip arrays.

Figure 12:
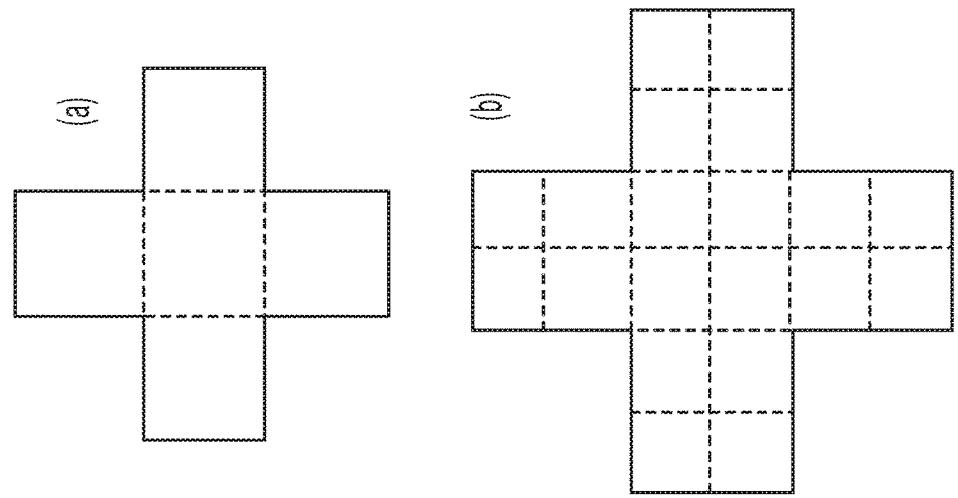
FIGS. 12a and 12b are a set of example cross patterns of image sensor units for incorporation into an image sensor chip.
Figure 13:
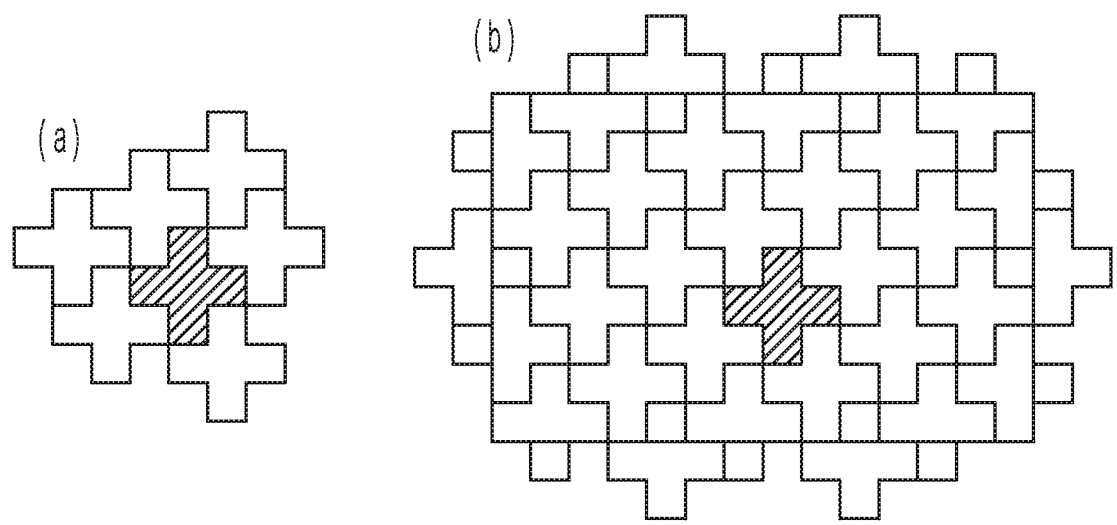
FIG. 13a is a geometric pattern of cross-shape image sensor chip arrays.
FIG. 13b is an example of a large area flat panel incorporating the geometric pattern of cross-shape image sensor chip arrays.
Figure 14:
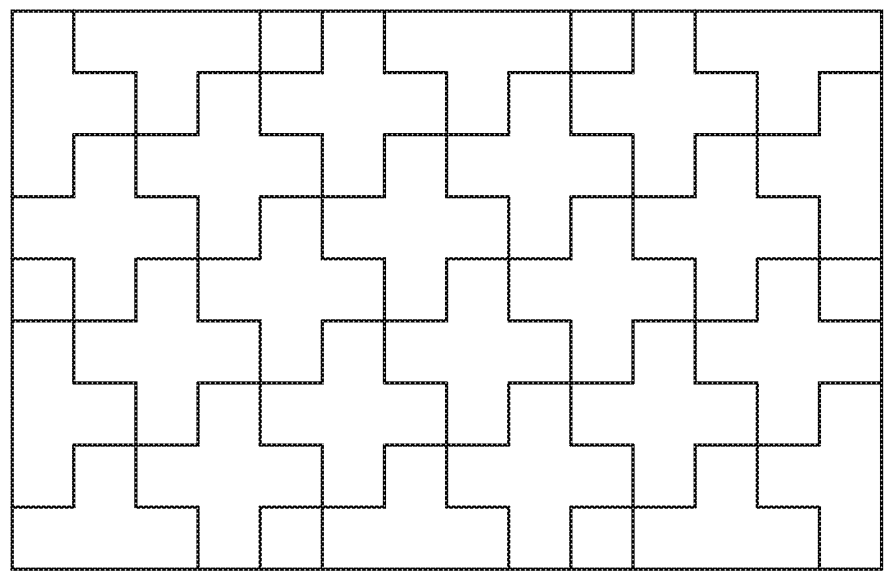
FIG. 14 is an example large area flat panel incorporating cross-shape image sensor arrays.

FIG. 12 shows a chip die arranged in a cross shape. FIG. 12(*a*) shows a single width cross pattern including a total of five image sensor units, one at the center and four units surrounding the center, one on each of the right, left, top, and bottom of the center unit. FIG. 12(*b*) is a double width cross pattern including a total of 20 image sensor units, in the same configuration as the single width described above replacing the single image sensor units with 2×2 image sensor arrays. One of ordinary skill will understand that the cross pattern chips may have any number of image sensor units. The cross pattern chips array may be arranged into a large area flat panel detector that would also solve the "lost line" problem. For example, FIG. 13(*a*) shows an example pattern using the cross pattern chip starting at the center of the panel and adding chips to fill out the desired size of the flat panel detector. FIG. 13(*b*) shows the full detector with all chips placed. FIG. 14, for example, shows a finished flat panel detector using cross pattern chips.

Referring now to FIGS. 15 and 16, an alternative hexagonal shape for use in image sensor arrays. FIG. 15(*a*) shows a single hexagonal unit chip. FIG. 15(*b*) shows a hexagonal unit chip having rectangle and triangle shaped image sensor pixels. FIG. 16(*a*) shows an example arrangement pattern of hexagonal pattern image sensor chip array that can be used to assemble a large area flat panel detector, an example of which is shown in FIG. 16(*b*), to solve the "lost line" problem also.

Figure 18:
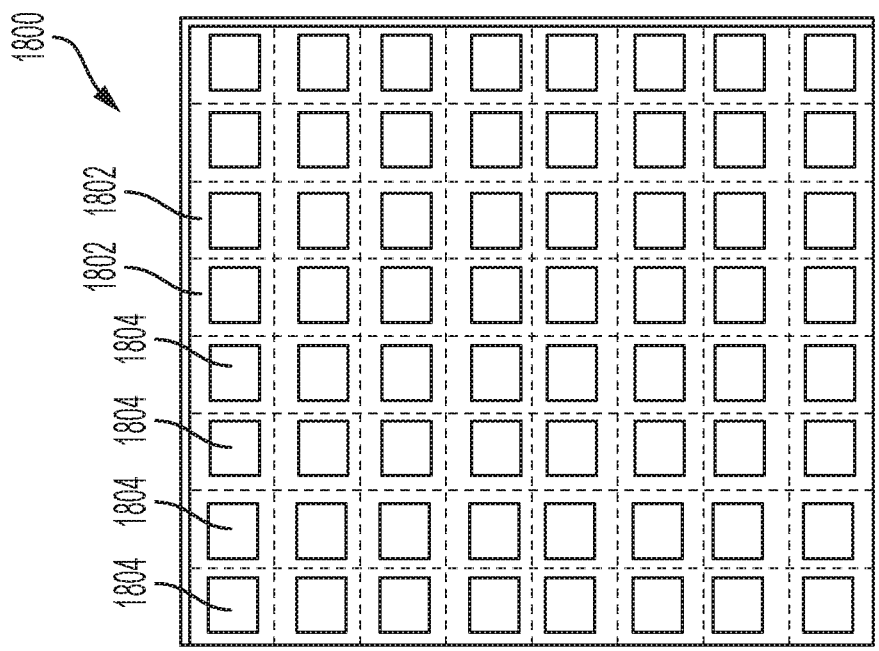
FIG. 18 shows a top view of a structured substrate for mounting an array of image sensor chips.
Figure 17:
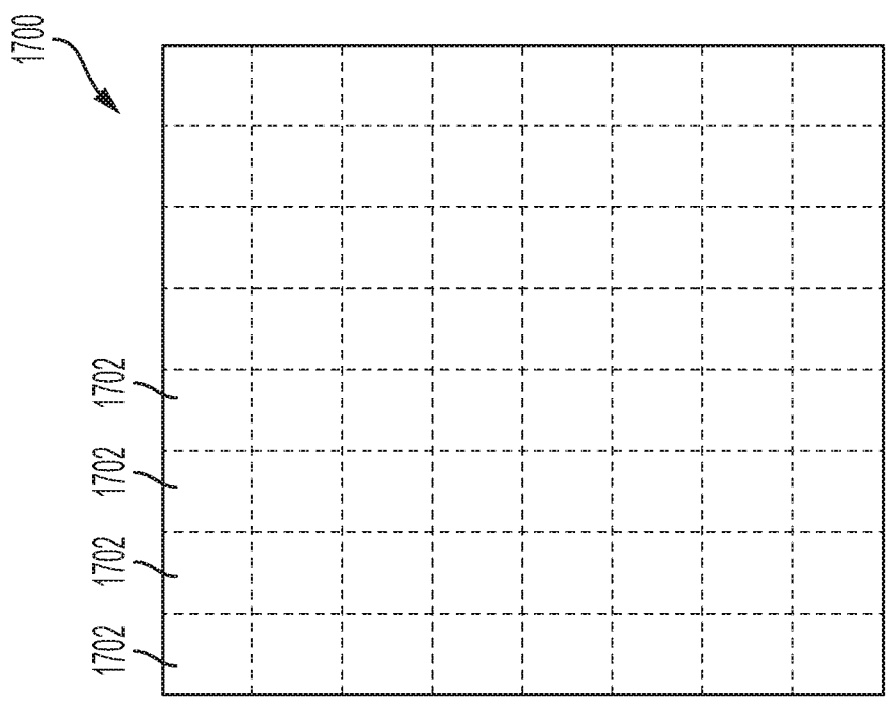
FIG. 17 is a diagram of an image sensor chip consisting of an 8×8 array of image sensor units.

Referring now to FIGS. 17-21, a process for manufacturing a large area imager assembly is described. Individual image sensor chips, regardless of the number of image sensor units it has on the die, are provided. For example, FIG. 17 shows a large-scale 8×8 array 1700 of image sensor units 1702. The array 1700 may be composed of a number of different chips in different size. Alternatively, array 1700 may also be composed of an 8×8 array of single unit image sensor chips 1702, and may be at wafer size. In any case, each square in the array 1700 is a single image sensor unit. FIG. 18 shows a structured substrate 1800 on which the array 1700 is to be mounted. The structured substrate includes openings 1804 for each image sensor unit. In the example shown in FIGS. 17 and 18, there is a one to one mapping between an image sensor unit 1702, regardless of the chip type or size, and each opening 1804 on the substrate. The pitches or footprints 1802 of the openings 1804 and that of the sensor units may match, for example. The image sensor unit sits on top of the opening and all the bumps/balls on the chip are exposed through the opening. The substrate 1800 can be any type of material whose coefficient of thermal expansion ("CTE") is similar to that of the material the image sensor chip is built on, for example ceramic, glass, silicon wafer, and the like. The openings 1804 may be large enough to allow access to all or a desired number of the bumps/pads of the corresponding image sensor unit, and enable connections to the solder paste domes or the electronically conductive adhesive balls dispensed on a printed circuit board ("PCB") for the assembly. The openings 1804 may also be small enough to hold the corresponding image sensor unit/chip on the substrate. The image sensor chip can be attached to the substrate by using ultraviolet ("UV") curable adhesives. The openings 1804 may be of any shape provided the above requirements regarding size are met, for example oval, circle, rectangle, square, octagon, or any other regular or irregular shape. The thickness of the substrate 1800 may be sufficient to mechanically support the image sensor chips on it while guaranteeing the electrical connectivity between the chips and the PCB or the like. A person of ordinary skill will recognize that the one-to-one configuration of substrate openings 1804 and sensor units 1702 is only an example, and implementations of the present invention are not limited in this regard. For example, a substrate may have multiple openings per sensor unit or per chip. In another example, a substrate may have a single opening correspond with multiple sensor units and/or chips.

Figure 19:
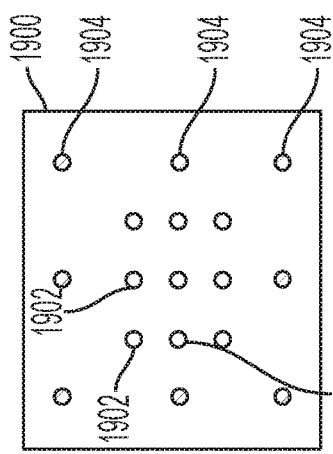
FIG. 19 is a diagram of an example pattern of connector pads/bumps for an image sensor unit.

Referring now to FIG. 19, the packaging of an image sensor unit 1900 is described. In the example of FIG. 19, dummy bumps/balls 1904 surround the bumps/balls array 1902 along all the sides. The dummy bumps/balls 1904 are used to strengthen and reinforce the structural connection between chip and the PCB. Each image sensor chip may be, for example, packaged using any appropriate packaging method, for example ball grid array, flip chip, chip-scale packaging. Wafer/panel level packaging technology enables connecting the die with other external components, for example, using through silicon via ("TSV") if a frontside illuminated ("FSI") image sensor is used. TSV technology is used to increase the fill factor and is packaged with bumps/balls on the non-photosensitive side of the die for power/bias/signal connections. With a backside illuminated ("BSI") image sensor, TSV is unnecessary for that purpose, and wafer/panel level packaging and bumping technology may be used to provide connection. In either case, the solder bumps/connections are located underneath the die.

A UV curable epoxy or similar material may be used to attach the chips on the structured substrate. All the external electronics needed for the detector are mounted on a printed circuit board ("PCB") with dispensed solder paste domes, or anisotropic conductive film ("ACF"), or electronically conductive adhesive balls on the pads for interconnecting the chips. If ACF is not used, the gap/space between the chips/substrate/PCB is filled with underfill having a coefficient of thermal expansion ("CTE") similar to that of silicon, through through-holes on the PCB board. If ACF is used, the ACF itself can be used as underfill. The underfill provides structural and mechanical reinforcement along the all edges. Preferably, the chips of the image sensor array are assembled starting in the center of the structured substrate, fanning out to all sides to finish the rest of the assembly.

Figure 21:
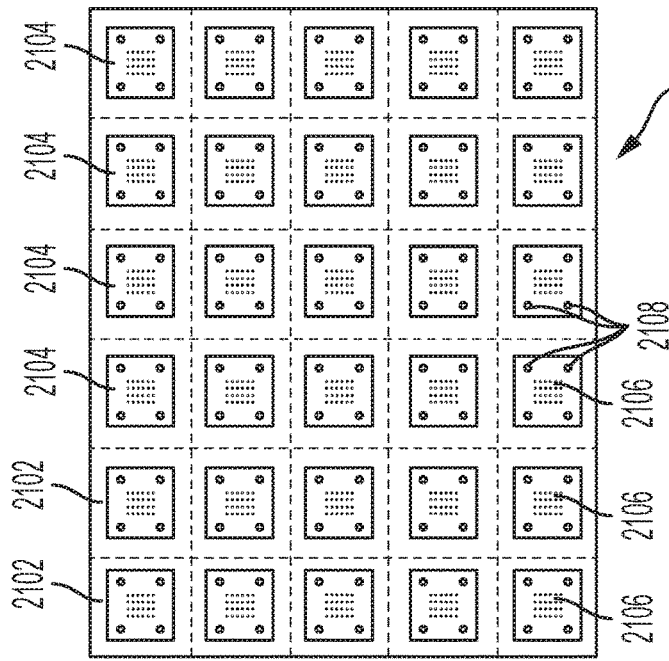
FIG. 21 is a top view of a printed circuit board that couples with image sensor array mounted on a structured substrate.
Figure 20:
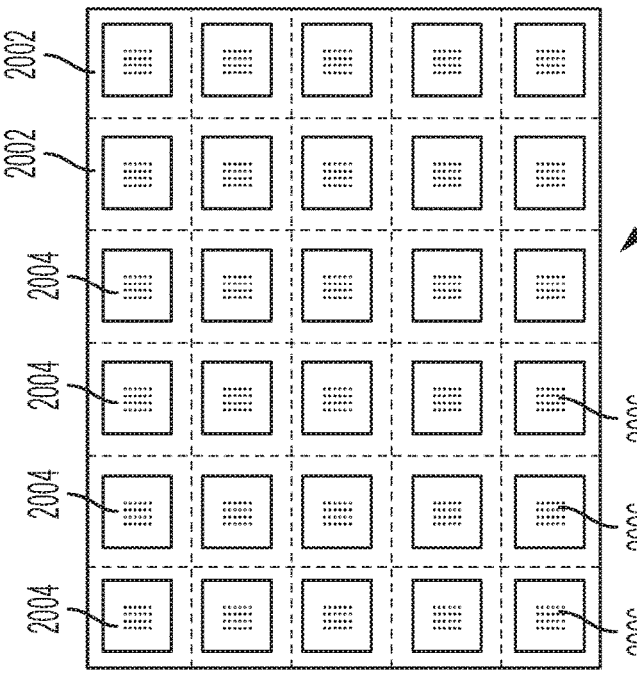
FIG. 20 is a bottom view of a structured substrate with image sensor chips attached.

Referring now to FIGS. 20, the bottom side view of a panel 2000 which includes a structured substrate with image sensor chips attached. The footprint of each image sensor unit is indicated by the dashed lines. Openings 2004, indicated by the square with solid edges, in the substrate 1800, enable access to pads or bumps 2006 of the image sensor chips for connection to the PCB 2100, shown in FIG. 21. FIG. 21 is a top side view of PCB 2100, which includes soldering pad arrays 2106 coupling to the corresponding image sensor units mounted on the substrate 2002. Area 2102 of the PCB 2100 is the portion that is in contact with substrate 2002. Each array of the soldering pads 2106 is located in an area 2104 (indicated by the square with solid edges) which matches the openings 2004 in the substrate. Multiple through-holes 2108 enable underfill to be injected into a cavity (e.g., cavity 2504 shown in FIG. 25 below) between the PCB 2100 and the panel 2000. Pad arrays 2106 on the PCB 2100 contact bumps 2006 of the image sensor units/chips through the openings 2004 to relay the signal from the detector array to appropriate processing hardware.

There are several ways to mount the panel 2000 to the PCB 2100. A first method is to form a solder paste dome on a solder pad on the PCB 2100 and heating the assembly to approximately 250° C. or any other desired temperature to reflow the solder and create a permanent joint. After the reflow, underfill is injected through the through-holes 2108 into the cavity between the image sensor chips 2002 and the PCB 2100. During underfilling, at least one of the through-holes is reserved for air flowing out of the closed space. A second method forms an electronically conducting adhesive epoxy ball on pad array 2106 and connecting the epoxy ball to contact bumps 2006 and cure the assembly at temperatures around 120° C., depending on the time it allows to cure. Underfill is injected through the through-holes 2108 into the cavity between the image sensor chips 2002 and the PCB 2100. A third method covers the pad arrays 2106 with ACF and applies appropriate pressure at a temperature in the range of approximately 150-170° C., to bond the panel 2000 to the PCB. The third method does not require reflow soldering or underfill injection, as the ACF provides the added structural reinforcement that would otherwise be provided by the underfill. The process of mounting the finished structured panel 2000 onto the PCB may be aided by alignment markings on both the substrate and the PCB.

Figure 22:
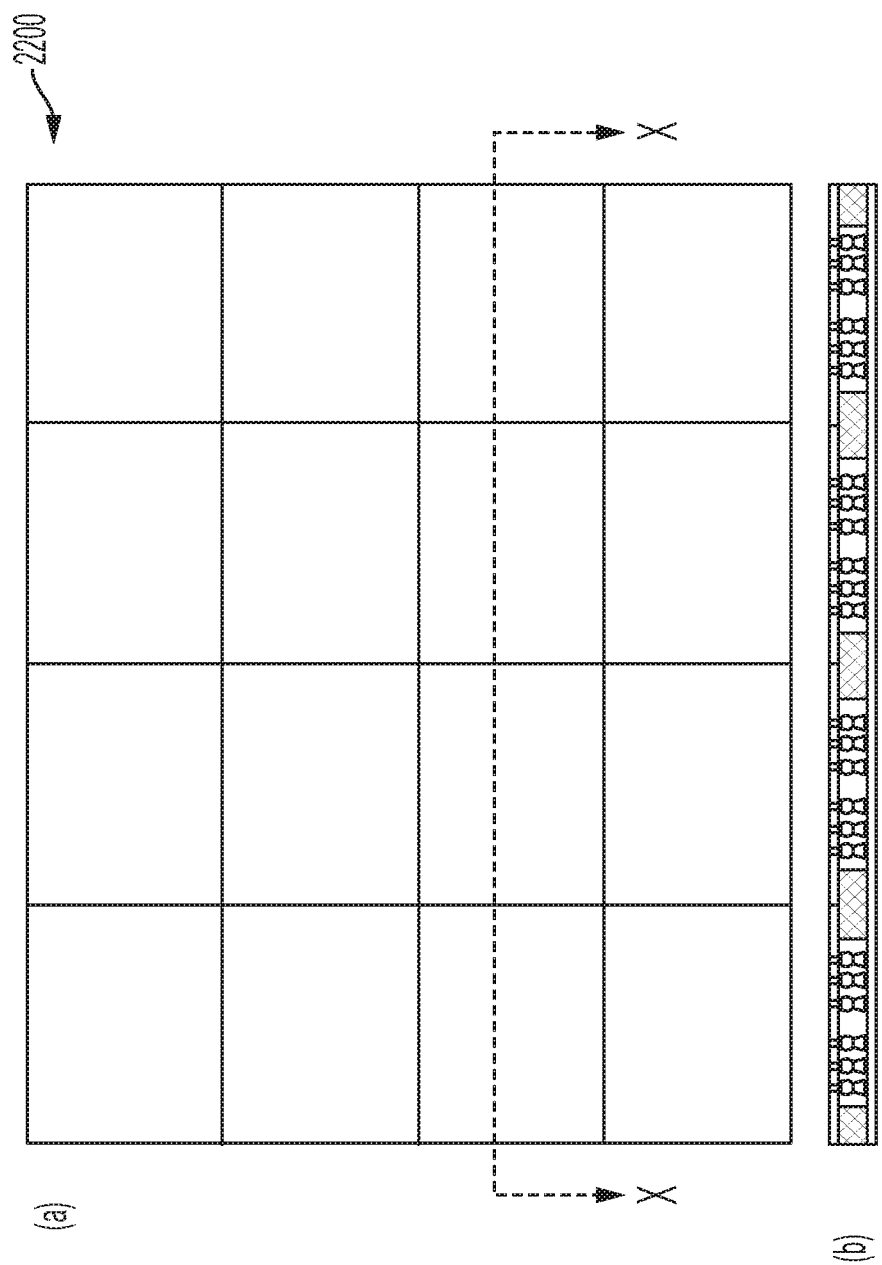
FIG. 22a is a top view of a portion of an assembled large area flat panel.
FIG. 22b is a cross-sectional view of an assembled large area panel.

Referring now to FIG. 22(a), a top view of an assembled imager array 2200 is described. In the example of FIG. 22, the imager array 2200 is a 4×4 array of single unit chips for clarity. The imager array 2200 may be of any size and may be constructed from any number of chips of different sizes. As noted above, the substrate always has a one to one relationship between openings and image sensor units, regardless of chip size. FIG. 22(b) is a cross-sectional view along the line X-X shown in FIG. 22(a) and described in greater detail below in reference to FIGS. 23-25.

Referring now to FIG. 23, a detail view of a partial cross-sectional view of the assembled imager array 2300 is described. Image sensor chips 2302 are attached to substrate 2304 and, through electrical contacts 2308 and 2310, to printed circuit board ("PCB") 2306. In the case of FSI sensor technology, through-silicon vias ("TSV") 2312 provide an electrical connection through the silicon die on which the image sensor unit is disposed. The electrical contacts 2308 and 2310 may be bumps/solder balls or electrical conductive adhesive paste, or any other suitable conductive material.

Region 2314 is shown in detail in FIG. 24 to show the structure of the connection between the image sensor unit 2402 and the PCB 2406. As noted above, TSV 2412 cuts directly through the die on which the image sensor unit 2402 is disposed. Electrical contact 2408 is formed on pad 2414, while on pad 2404 electrical contact 2410 is formed. Electrical contacts 2408 and 2414 form a complete connection through which an analog or digital signal that is generated or required by the image sensor unit propagates.

Referring now to FIG. 25, through-holes 2502 are shown for the injection of underfill into cavity 2504. For each cavity 2504 at least one through-hole on the PCB is used to inject the underfill, and at least one through-hole is reserved for letting the air out while underfilling the cavity.

In one embodiment, instead of having aforementioned large openings exposing an array of electrical contacts 2308, the structured substrate can have array of through-holes to expose electrical contacts of the image sensor unit and connect to the PCB. Each through-hole, for example, may correspond to an electrical contact from the image sensor array attached to the substrate. All the aforementioned assembly methods may be applied to complete the assembly of image sensor chips on the substrate and the PCB.

In one embodiment, the openings in the substrate may be array of through vias conducting electrical signal from one layer to the other, as a panel size interposer between the image sensor chip array and the PCB. The imager assembly may have a single panel size interposer, or an array of interposers. All the aforementioned assembly methods may be applied to complete the assembly of image sensor chips on the interposer and the PCB.

There are many advantages of the presently disclosed implementations over those of the prior art. Instead of fabricating a whole large panel or tiling several (for example, six) pieces of wafer size imagers to form a large panel, the disclosed methods and devices use small units/chips. Although a unit or chip may be at wafer size, a person of ordinary skill will recognize that cost and manufacturability considerations may indicate that smaller units are preferable.

A person of ordinary skill would understand how to apply the assembly methodologies disclosed in this invention to make silicon photomultiplier (SiPM) based gamma ray detectors.

While the foregoing is directed to embodiments of the present invention, other and further embodiments of the invention may be devised without departing from the basic scope thereof, and the scope thereof is determined by the claims that follow.

What is claimed is:

1. A method of constructing a flat panel image sensor, the method comprising:
mounting a plurality of image sensor chips on a substrate, wherein the substrate includes a plurality of openings, wherein each of the plurality of openings enables access to at least one image sensor unit of the plurality of image sensor units, and wherein each image sensor chip includes at least one chip contact array and wherein at least one contact of each image sensor unit is accessible through at least one opening, wherein the openings are through-holes that each correspond to a single contact of the plurality of image sensor units, optionally wherein the openings are electrically conductive through vias;
attaching a printed circuit board ("PCB") to the substrate, wherein the PCB includes a plurality of PCB contact arrays, wherein each PCB contact array is configured to be placed in alignment and in electrical connection with a corresponding chip contact array;
forming on each PCB contact array and each chip contact array a ball of electrically conductive adhesive paste;
aligning the substrate and the PCB so that each ball of electrically conductive adhesive paste is in contact with one electrical contact pad to form an image sensor assembly; and
curing the image sensor assembly.

2. The method according to claim 1, further comprising injecting underfill into at least one of the through-holes to provide additional structural support for the large area flat panel image sensor.

3. The method according to claim 1, wherein each of the plurality of image sensor units comprises:
a memory configured to store pixel locations, wherein the pixel locations specify one or more of a pre-defined readout pattern of pixels, pixels marked for repair, and pixels marked to skip readout; and
at least one signal amplifier configured to output amplified signals.

4. The method according to claim 1, further comprising mounting the image sensor chips onto substrate first at a center of the substrate, then progressively outward toward one or more edges of the substrate.

5. The method according to claim 1, wherein the substrate includes an opening for every at least two image sensor units.

6. The method according to claim 1, wherein the PCB is attached to the substrate using conventional soldering, or anisotropic conductive film or the like.

7. The method according to claim 1, wherein the openings are electrically conductive through vias.

* * * * *